(12) United States Patent
Liao et al.

(10) Patent No.: US 12,087,580 B2
(45) Date of Patent: Sep. 10, 2024

(54) METHOD OF MANUFACTURING SEMICONDUCTOR DEVICES

(71) Applicant: TAIWAN SEMICONDUCTOR MANUFACTURING COMPANY, LTD., Hsinchu (TW)

(72) Inventors: Chun-Wei Liao, Taoyuan (TW); Tung-Hung Feng, Hsinchu (TW); Hui-Chun Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/461,570

(22) Filed: Aug. 30, 2021

(65) Prior Publication Data
US 2023/0063235 A1    Mar. 2, 2023

(51) Int. Cl.
*H01L 21/027* (2006.01)
*G03F 7/00* (2006.01)
*G03F 7/11* (2006.01)
*G03F 7/16* (2006.01)

(52) U.S. Cl.
CPC ........ *H01L 21/0274* (2013.01); *G03F 7/0035* (2013.01); *G03F 7/11* (2013.01); *G03F 7/168* (2013.01)

(58) Field of Classification Search
CPC ...... H01L 21/0274; G03F 7/0035; G03F 7/11; G03F 7/168
See application file for complete search history.

(56) References Cited

U.S. PATENT DOCUMENTS

| | | | |
|---|---|---|---|
| 5,221,596 A * | 6/1993 | Keller | G03F 7/0758 430/326 |
| 8,796,666 B1 | 8/2014 | Huang et al. | |
| 9,093,530 B2 | 7/2015 | Huang et al. | |
| 9,213,234 B2 | 12/2015 | Chang | |

(Continued)

FOREIGN PATENT DOCUMENTS

| | | | | |
|---|---|---|---|---|
| CN | 109962026 A * | 7/2019 | | G03F 7/161 |
| EP | 0126266 A2 * | 11/1984 | | G03F 7/161 |

(Continued)

OTHER PUBLICATIONS

Clark, Benjamin L., et al. "Coater/developer process integration of metal-oxide based photoresist." Advances in Patterning Materials and Processes XXXII. vol. 9425. SPIE, 2015. (Year: 2015).*

*Primary Examiner* — Mark F. Huff
*Assistant Examiner* — Moriah S. Smoot
(74) *Attorney, Agent, or Firm* — STUDEBAKER & BRACKETT PC

(57) ABSTRACT

In a method of manufacturing a semiconductor device, a hydrophobic solvent as a gas is directed to flow over a bevel region of a wafer. A layer of the hydrophobic solvent is deposited on an upper bevel of the bevel region on top surface of the wafer and on a lower bevel of the bevel region on bottom surface of the wafer. A metal-containing photo resist layer is disposed on an internal region of the top surface of the wafer enclosed by the bevel region. During a subsequent processing operation, a photo resist material of the metal-containing photo resist layer is blocked off inside the top surface of the wafer by the layer of the hydrophobic solvent.

20 Claims, 10 Drawing Sheets

(56) References Cited

U.S. PATENT DOCUMENTS

| | | | |
|---|---|---|---|
| 9,223,220 B2 | 12/2015 | Chang | |
| 9,256,133 B2 | 2/2016 | Chang | |
| 9,536,759 B2 | 1/2017 | Yang et al. | |
| 9,548,303 B2 | 1/2017 | Lee et al. | |
| 9,711,367 B1 * | 7/2017 | Chien | H01L 21/308 |
| 9,857,684 B2 | 1/2018 | Lin et al. | |
| 9,859,206 B2 | 1/2018 | Yu et al. | |
| 9,875,892 B2 | 1/2018 | Chang et al. | |
| 2007/0062647 A1 * | 3/2007 | Bailey | H01L 21/02087 |
| | | | 156/345.33 |
| 2015/0060401 A1 * | 3/2015 | Chang | C03C 19/00 |
| | | | 216/38 |
| 2015/0314322 A1 * | 11/2015 | Chang | B05D 1/005 |
| | | | 427/535 |
| 2020/0073244 A1 * | 3/2020 | Kang | G03F 7/165 |

FOREIGN PATENT DOCUMENTS

| | | | | |
|---|---|---|---|---|
| EP | 2228684 A2 * | 9/2010 | | G03F 7/0035 |
| JP | 2009194239 A * | 8/2009 | | C09J 5/02 |
| JP | 2018049987 A * | 3/2018 | | B05D 1/005 |
| KR | 20090088808 A * | 8/2009 | | |
| WO | WO-2015168231 A1 * | 11/2015 | | C03C 17/001 |

* cited by examiner

METHOD OF MANUFACTURING SEMICONDUCTOR DEVICES

BACKGROUND

As semiconductor device sizes continue to shrinks, extreme ultraviolet lithography (EUVL) systems using extreme ultraviolet (EUV) radiation have been developed to form smaller semiconductor device feature sizes and increase device density on a semiconductor wafer. Because metals have high EUV absorbance, metal-containing photoresists (MePR) have been developed to provide improved EUVL. Metal-containing photoresists may contaminate the modules of a wafer patterning system performing the processes of baking, lithography, and developing if the MePR is not contained on the top surface of the wafer. An efficient technique to contain the MePR on the top surface of the wafer, to prevent contamination of the wafer patterning system, and to prevent the contamination of the systems performing subsequent process operations is desirable.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
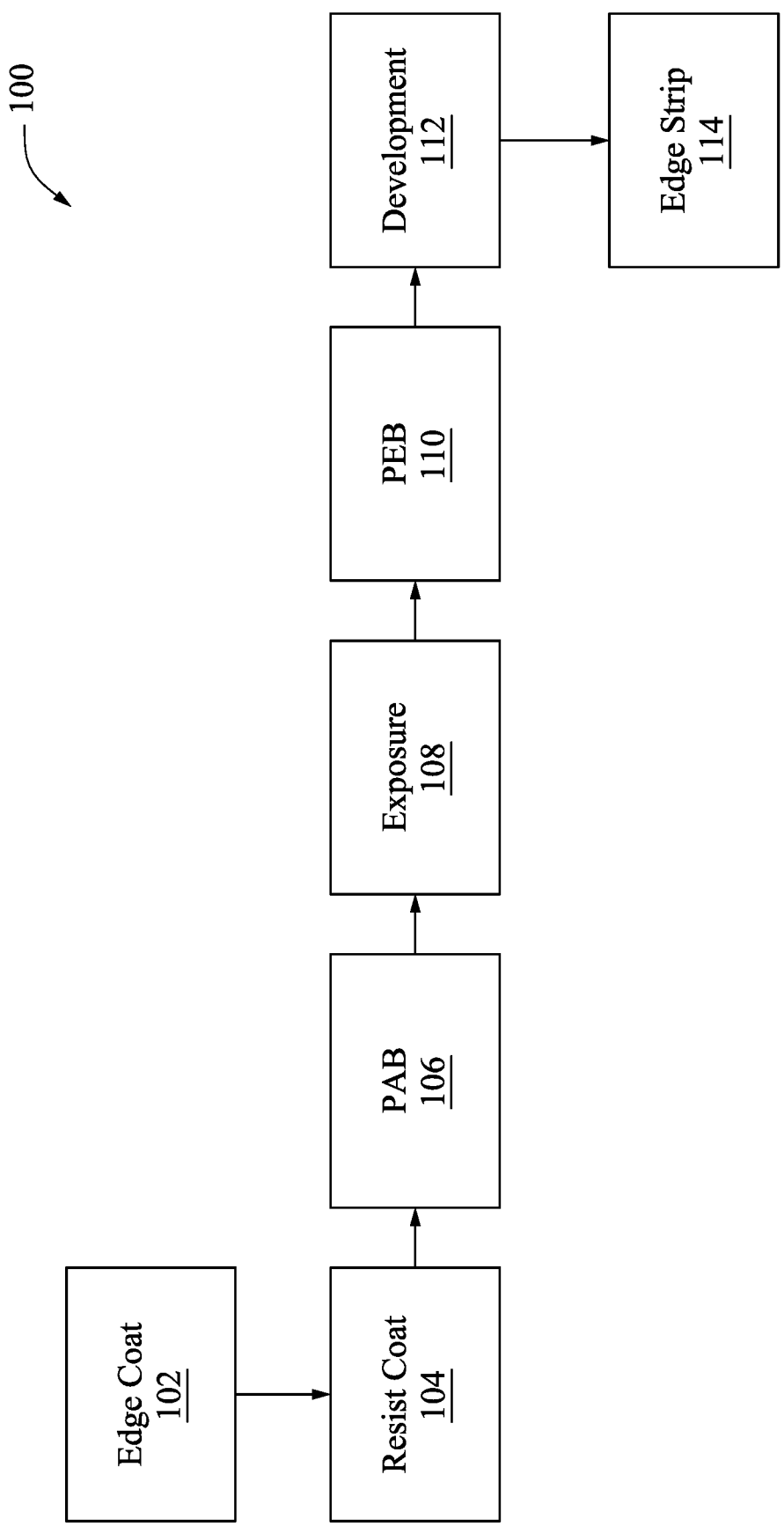
FIG. 1 shows a process flow for disposing a resist pattern on a wafer in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In some embodiments, the MePR is used for lithography. The metal in the MePR is a contaminant if it escapes from the photoresist or the photoresist is not contained on the top surface of the wafer. An edge coating operation is performed to the wafer edge in some embodiments to prevent the MePR from spilling from the wafer edge and keep the MePR away from wafer edge, and to prevent contaminating other process locations through which the wafer is transferred during subsequent process operations. A protective composition is applied to edges of the wafer to protect the edges, sides, and backside of the wafer. The protective composition is baked and then the MePR is coated on a top surface of the wafer. Following the application of the MePR to the surface of the wafer, the protective composition is removed and then the photoresist undergoes a post-application bake (PAB) operation which is a pre-exposure heating (or soft bake) to drive off solvents or cure the metal-containing photoresist.

The protective composition may include a polymer with an acid-labile group (ALG) and a thermal acid generator (TAG) or a photo-acid generator (PAG) in a solvent. When the TAG or PAG is activated, an acid is released, which cleaves the ALG on the polymer causing the polymer to cross-link and cure, e.g., harden. In some embodiments, the solvent of the protective composition is propylene glycol methyl ether acetate (PGMEA). The protective composition is removed before the exposure operation by the lithography system because the protective composition may contaminate and affect the exposure operation. In some embodiments, after the exposure operation, another protective layer is deposited on the edges of the wafer and baked to protect the edges, sides, and backside of the wafer to prevent the MePR from spilling from the wafer edge during subsequent operations of post exposure bake and development.

In some embodiments, a hydrophobic solvent is used as the protective layer and a layer of the hydrophobic solvent is deposited on the edges of the wafer to protect the edges, sides, and backside of the wafer. The deposited hydrophobic solvent does not contaminate or affect the exposure step and thus the deposited hydrophobic solvent is not removed from the edges of the wafer prior to the exposure operation. In some embodiments, the hydrophobic solvent remains during the subsequent operations of post exposure bake and development. In some embodiments, the deposited hydrophobic solvent on the edges of the wafer is removed, e.g., rinsed, after the development operation. Once it is deposited, it is not necessary to bake the hydrophobic solvent when using a layer of the hydrophobic solvent as the protective layer on the edges of the wafer to prevent spilling of the MePR.

In some embodiments, the hydrophobic solvent is delivered as a gas to the edges of the wafer when deposited on the edges of the wafer. Because the hydrophobic solvent molecules are non-polar, the wafer surface covered by the hydrophobic solvent molecules changes from polar to non-polar. Also, the MePR molecules include a Sn—OH structure that causes the surface of the wafer covered by the MePR to become polar. Thus, the protective layer of hydrophobic solvent does not bond with MePR, and causes the metal element of MePR to remain on the wafer surface and prevents the metal elements from spilling over the wafer surface.

FIG. 1 shows a process flow 100 for disposing a resist pattern on a semiconductor substrate in accordance with some embodiments of the present disclosure. In some embodiments, the process flow 100 is performed by the system 800 of FIG. 8 and controlled by the computer system 1000 of FIGS. 10A and 10B. In an edge coat operation 102, a hydrophobic solvent is deposited on an edge region of a semiconductor wafer. As shown in FIG. 3A a hydrophobic solvent layer 302 is deposited on an edge region 304, e.g., a bevel region, consistent with the edge region 213 of FIG. 2, of the semiconductor wafer 210. In a resist coat operation 104, a resist layer of a resist material is disposed, e.g., coated, on a top surface of the wafer or a work piece. As shown in FIG. 4B, a photo resist layer 320 is disposed over the wafer 210. The photo resist layer 320 is disposed on a central region of the wafer that is enclosed by the hydrophobic solvent layer 302. The post application bake (PAB) is performed at a PAB operation 106 and the wafer 210 including the photo resist layer 320 is baked to drive out solvent in the resist material and solidify the photo resist layer on top of the wafer 210. In some embodiments, the PAB operation is performed at a temperature ranging from about 40° C. to about 150° C.

At exposure operation 108, the resist layer is irradiated with actinic radiation or a charged particle beam to project a pattern onto the resist layer. In some embodiments, a layout pattern on a mask is projected by EUV radiation from an EUV light source onto the resist layer to generate the layout pattern in the resist layer on the wafer. In some embodiments, the layout pattern is projected while the hydrophobic solvent layer 302, deposited in operation 102, remains on the edge of the wafer 210. At operation 110, a post exposure bake (PEB) is performed on the wafer and at operation 112, by applying a developer solution, the resist material of the resist layer is developed. The operations 110 and 112 are performed while the hydrophobic solvent layer 302, deposited in operation 102, remains on the edge of the wafer 210 in some embodiments. In some embodiments, the PEB is performed at a temperature ranging from about 50° C. to about 200° C. For a positive tone resist material, the exposed regions are removed by applying a developer solution and the layout pattern is generated in the resist layer. For a negative tone resist material, the non-exposed regions are removed by applying the developer solution and the layout pattern is generated in the resist layer. In the present disclosure, the terms mask, photomask, and reticle are used interchangeably. In addition, the terms resist and photo resist are used interchangeably. In an edge strip operation 114, when edge coating operation 102 is performed in the process flow, the strip step operation 114 removes, e.g., strips, the hydrophobic solvent layer 302 after the development operation 112. However, the hydrophobic solvent layer 302 is not removed for the exposure operation 108, because the hydrophobic solvent layer 302 does not interfere with the exposure operation 108.

Figure 2:
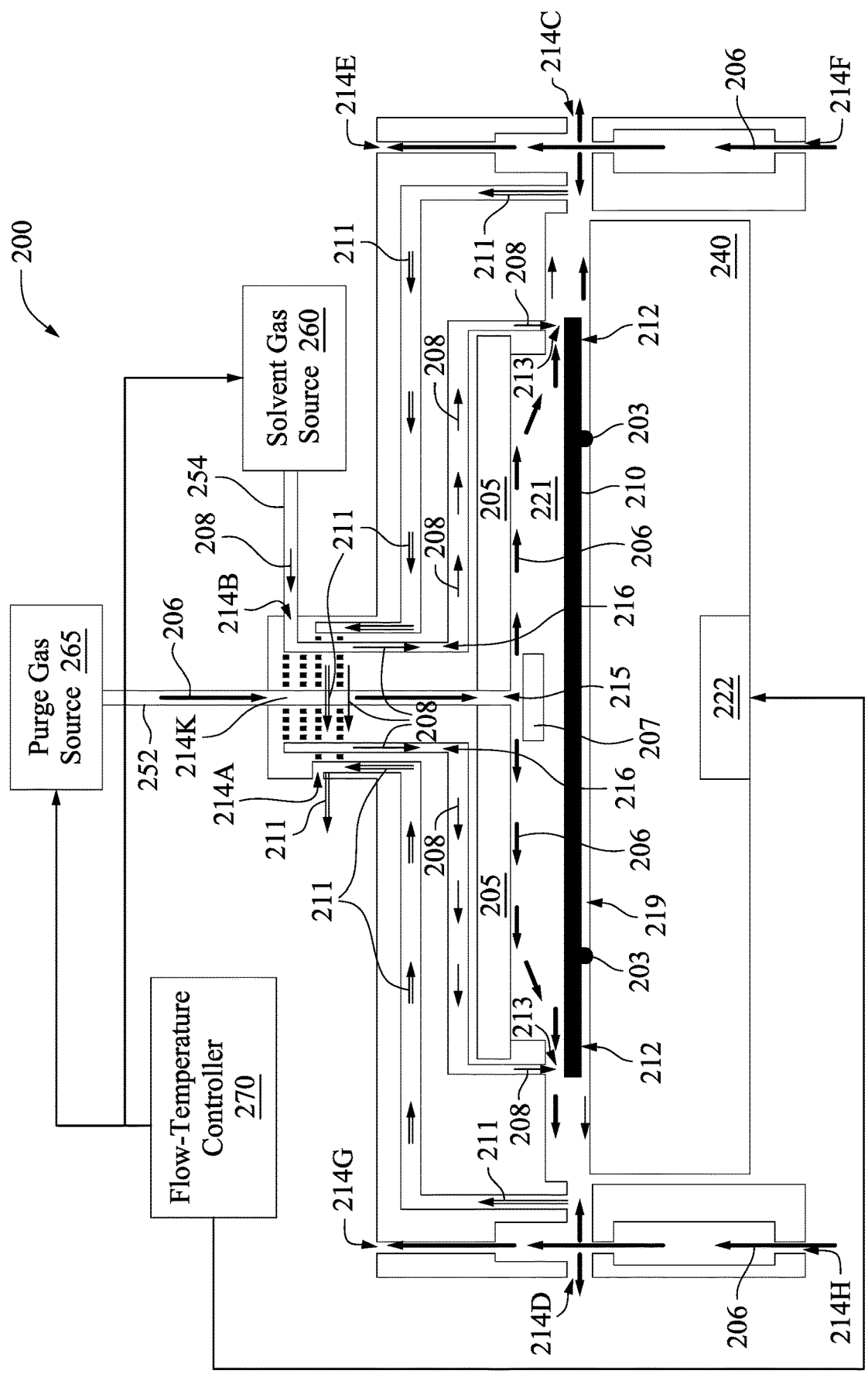
FIG. 2 shows an edge coating device in accordance with some embodiments of the present disclosure.

FIG. 2 shows an edge coating device 200 in accordance with some embodiments of the present disclosure. The edge coating device 200 includes a stage 240 having a heating element 222. A wafer 210 is mounted over the stage and a shielding barrier 205, e.g., a shielding disk, is mounted over the wafer 210. The shielding barrier 205 covers a central region of the wafer 210 and leaves an edge region 213 of the wafer 210 exposed. FIG. 2 includes a hydrophobic solvent gas source 260 that is connected via a pipe 254 to the input gas port 214B of the edge coating device 200 and a flow 208 of the hydrophobic solvent in gas form is provided by the hydrophobic solvent gas source 260 to the edge coating device 200. As shown, the flow 208 of the hydrophobic solvent is directed through the holes 216, e.g., openings, and is redirected by the shielding barrier 205 to flow in parallel above the shielding barrier 205 and to come into contact with the wafer 210 at the edge regions 213. In some embodiments, the hydrophobic solvent is hexamethyldisilazane (HMDS).

In some embodiments, as shown in the edge coating device 200, the heating element 222 of the stage 240 is coupled to and is controlled by a gas flow-temperature controller 270 and the stage 240 is set at a temperature between about 50° C. and about 180° C. The hot stage 240 provides heat to the wafer 210 to maintain the wafer 210 at a temperature between about 50° C. and about 180° C. and helps the flow 208 of the hydrophobic solvent to be deposited in the edge region 213 of the wafer 210. FIG. 2 also includes a purge gas source 265 that is connected via a pipe 252 to the input gas port 214K of the edge coating device 200 and a flow 206 of the purge gas (e.g., nitrogen gas) is provided by the purge gas source 265 to the edge coating device 200. As shown, the flow 206 of the purge gas is directed through holes 215, e.g., openings, in the shielding barrier 205 and is re-directed by another shielding barrier 207, e.g., a shielding disk, to flow in parallel above the wafer 210. In some embodiments, as shown, the shielding barrier 207 is placed in a gap 221 between the wafer 210 and the shielding barrier 205. In some embodiments, the purge gas is also directed through the input gas ports 214C, 214D, 214F, and 214H. In some embodiments, while the hydrophobic solvent is deposited on the edge region 213, the flow 206 of the purge gas begins to purge and to prevent the flow 208 of the hydrophobic solvent from spilling over the edge region 213 of the wafer 210. In some embodiments, the flow 206 of the purge gas mixes with the flow 208 of the hydrophobic solvent and generates a mixed flow of 211 that exits the edge coating device 200 at the exit gas port 214A. In some embodiments, a portion of the flow 206 of the purge gas exits the edge coating device 200 at the exit gas ports 214E and 214G. In some embodiments, a width of the shielding barrier 207 is between about 5 percent and about 50 percent of a width of the shielding barrier 205. In some embodiments, the stage 240 includes raising pins 203 that can raise the wafer 210 above the top surface of the stage 240 and produce a gap 219 of about 0.1 mm to about 5 mm between the wafer 210 and the top surface of the stage 240 such that the flow 208 of the hydrophobic solvent may enter the gap 219 and get deposited on the edge region 212 under the wafer 210, e.g., a lower bevel of the wafer 210.

In some embodiments, the flow-temperature controller 270 is coupled to the hydrophobic solvent gas source 260 and the purge gas source 265 and controls a flow rate from the hydrophobic solvent gas source 260 and from the purge gas source 265, and, thus, controls a flow rate of the flow 206 of the purge gas and the flow 208 of the hydrophobic solvent. In some embodiments, the flow 208 of the hydrophobic solvent in the edge coating device 200 is maintained at a flow rate between about 0.1 liter per minute (L/min) and about 4 L/min during the deposition of the hydrophobic solvent layer 302 in the edge region 304. In some embodiments, as shown in FIG. 3B, a portion of the flow 208 of the hydrophobic solvent flows under the wafer 210 and is deposited in an edge region 212 under the wafer 210.

Figure 3C:
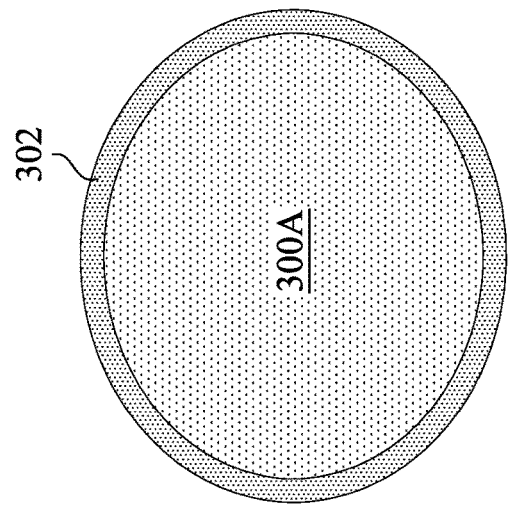
FIGS. 3A, 3B, and 3C show a wafer with a hydrophobic solvent layer deposited on an edge region of the wafer in accordance with some embodiments of the present disclosure.
Figure 3A:
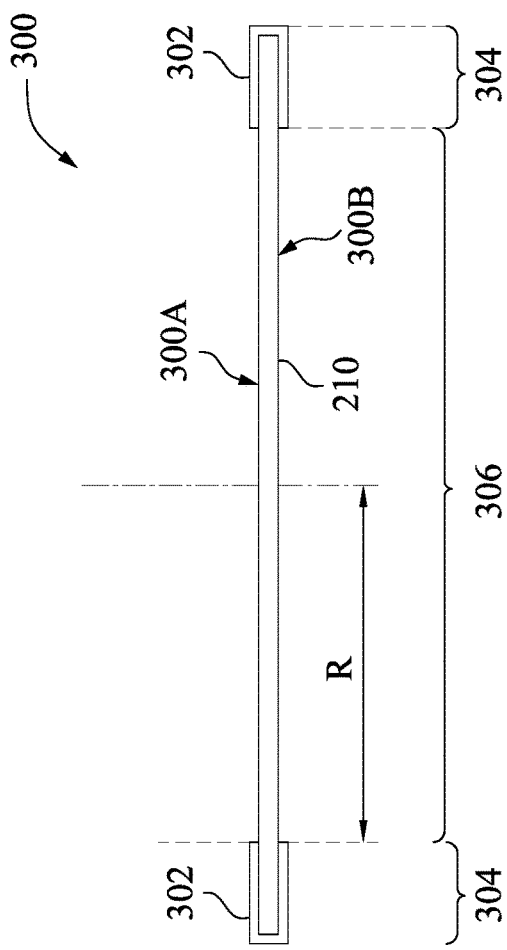
Figure 3B:
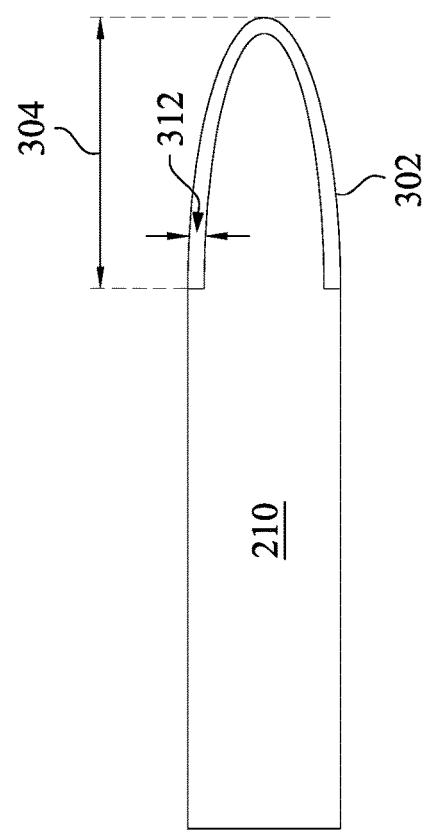
Figures 4A, 4B:
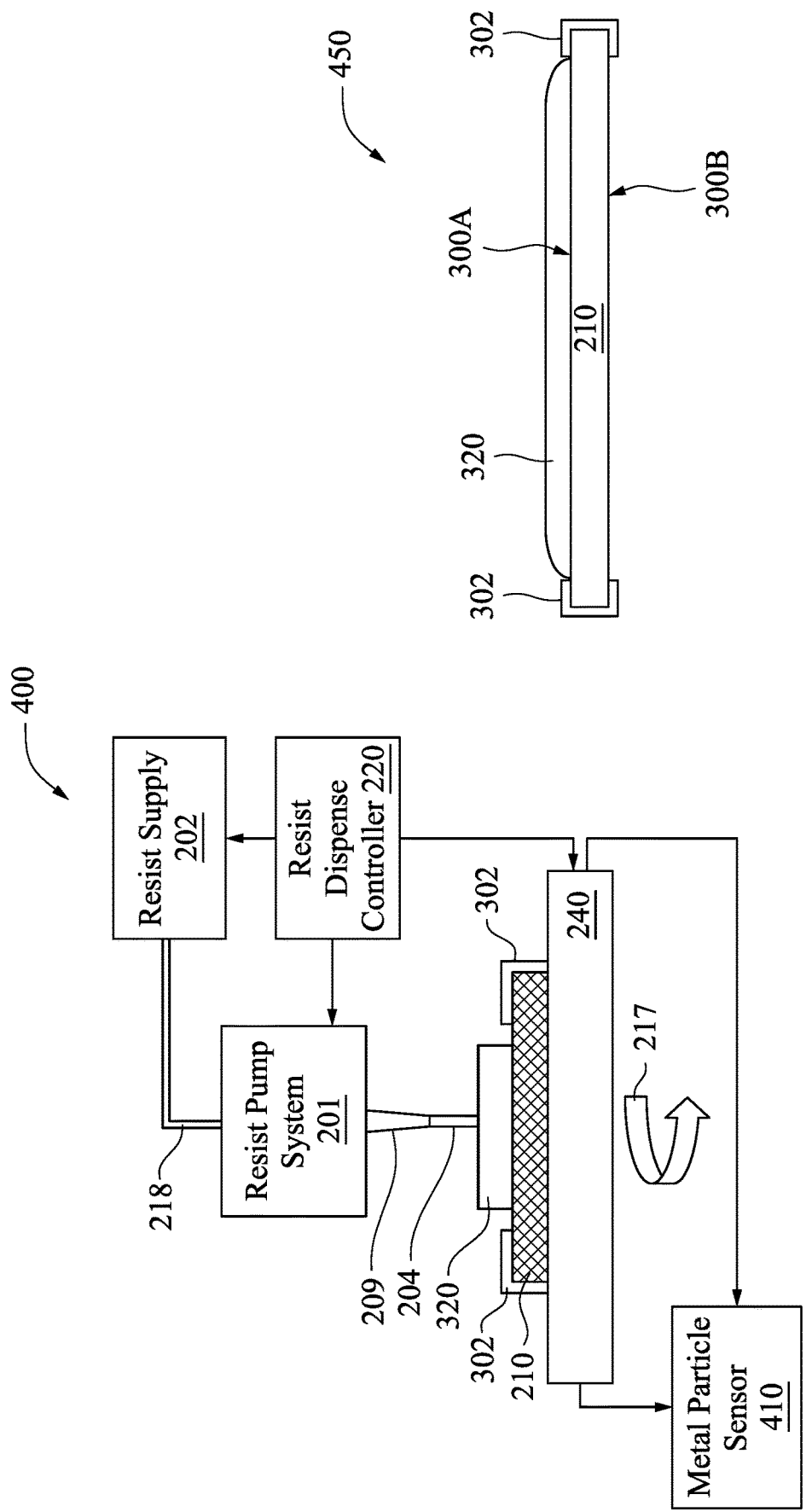
FIGS. 4A and 4B show a resist dispensing module and a wafer with a hydrophobic solvent layer deposited on an edge region of the wafer and a resist layer disposed in the central region of the wafer in accordance with some embodiments of the present disclosure.

FIGS. 3A, 3B, and 3C show a wafer with a hydrophobic solvent layer deposited on an edge region of the wafer in accordance with some embodiments of the present disclosure. FIG. 3A shows a wafer 300 with a central region 306 having a radius R, an edge region 304, an upper surface 300A, and a lower surface 300B. As shown in FIG. 3A, the hydrophobic solvent layer 302 is deposited over the edge region 304 and covers the bevel including the upper surface and the lower surface in the edge region 304. FIG. 3B shows the edge region 304 of the wafer 210 having the hydrophobic solvent layer 302 with a thickness 312. FIG. 3C is a top view of the wafer 210 and shows the upper surface 300A that is exposed and the edge region 304 that is covered by the hydrophobic solvent layer 302. In some embodiments, a width of the edge region 304 that the hydrophobic solvent is deposited is between about 1 percent to about 5 percent of a radius of the wafer 210 or the radius R of the central region 306.

FIGS. 4A and 4B show a resist dispensing module 400 and a wafer 450 with a hydrophobic solvent layer deposited on an edge region of the wafer and a resist layer disposed in the central region 306 of the wafer in accordance with some embodiments of the present disclosure. FIG. 4A shows the resist dispensing module 400 for dispensing the resist material 204 over the wafer 210 to form a resist layer 320.

The resist material 204 is dispensed from a resist dispensing nozzle 209. In some embodiments, a resist dispense controller 220 is coupled to a resist pump system 201 to control a thickness of the resist layer 320 that is produced on the wafer 210. The resist pump system 201 that is coupled to the resist dispensing nozzle 209 transfers the resist material from a resist supply 202, via a pipe 218 (e.g., a conduit, or a tube), to the resist dispensing nozzle 209. In some embodiments, the wafer 210 is placed on a stage 240 and the stage 240 rotates around a rotation direction 217 to uniformly distribute the resist material on the wafer 210. In some embodiments, the hydrophobic solvent layer 302 is provided at the edge region 213 of the wafer 210 to prevent the resist material from touching the solvent layer and the resist material remains on the wafer 210. In some embodiments, the resist dispense controller 220 is also coupled to a stage controller (not shown) in the stage 240 to synchronize the dispensing of the resist material and the rotation of the wafer 210. In some embodiments, the wafer 210 is used for manufacturing a semiconductor device and, thus, includes one or more layers of the semiconductor device below the resist layer 320. In some embodiments, the stage 240 rotates around a direction opposite to the rotation direction 217. As discussed, in some embodiments, the resist material 204 is the MePR. In some embodiments, a metal particle sensor 410 is coupled to the stage 240 to measure the number of metal particles per unit area, e.g., squared centimeter, on top of the stage 240.

In some embodiments, the metal element of the MePR is tin (Sn). In some embodiments, a density of the metal particles on the edge region of the wafer 210, on an upper bevel of the bevel region on upper surface 300A of the wafer, and on a lower bevel of the bevel region on lower surface 300B of the wafer 210 is determined. When a protective layer is not used in the edge region 304 and when the wafer 210 is bare wafer, the surface density of the metal particles per centimeter squared is between $40\,e^{10}$ and $60\,e^{10}$ counts/cm$^2$, however, when the protective layer is used and the hydrophobic solvent layer 302 is deposited, the surface density of the metal particles per centimeter squared is reduced by about 96% to between $1.6e^{10}$ and $3.6e^{10}$ in some embodiments. In some embodiments, the surface density of the metal particles is about $2.2e^{10}$ particles/cm$^2$. When a protective layer is not used in the edge region 304 and when the wafer 210 is not a bare wafer, e.g., a patterned tri-layer resist is on the wafer 210, the surface density of the metal particles per centimeter squared is between $60e^{10}$ and $80e^{10}$, however, when the protective layer is used and the hydrophobic solvent layer 302 is deposited, the surface density of the metal particles per centimeter squared is reduced by about 36% to between $38e^{10}$ and $51e^{10}$ in some embodiments. In some embodiments, the surface density of the metal particles is about $45e^{10}$ particles/cm$^2$. In some embodiments, when the surface density of the metal particles is above a threshold of about $3.0e^{10}$ for a bare wafer and about $50e^{10}$ for a wafer with the tri-layer resist, the amount of time the wafer 210 is subjected to the edge coating in the edge coating device 200 is increased, and the thickness of the hydrophobic solvent layer 302 is increased for subsequent wafers. In some embodiments, the duration of the flowing the gaseous hydrophobic solvent over the edge region 304 of the wafer 210 in the edge coating device 200 is between about 10 minutes and about 4 hours, and, between about 30 minutes and about 2 hours in other embodiments.

FIG. 4B shows a wafer 450 having an upper surface 300A and lower surface 300B. The hydrophobic solvent layer 302 is deposited at the edge reign of the wafer 210. The resist layer 320 is disposed in the central region 306 of the wafer 210. Because of the hydrophobic solvent layer 302 and the water in the resist layer 320, the resist layer 320 is repelled by the hydrophobic solvent layer 302 and, thus, is kept away from the edge of the wafer 210. In some embodiments, a thickness 312 of the hydrophobic solvent layer 302 is between about 0.2 percent and 10 percent of a thickness of the resist layer 320, and, between about 1 percent and 5 percent in other embodiments. In some embodiments, the thickness of the solvent layer 302 is between 0.5 Angstroms (A°) and 50 A° and the thickness of the resist layer 320 is between 100 A° and 500 A°. In other embodiments, the thickness of the solvent layer 302 is between 0.5 A° and 15 A° and the thickness of the resist layer 320 is between 250 A° and 290 A°. In some embodiments, the resist layer is a MePR layer and the hydrophobic solvent layer 302 prevents the MePR layer from touching the solvent layer 302 and causes the MePR layer to remain away from the edge of the wafer 210.

Figure 5:
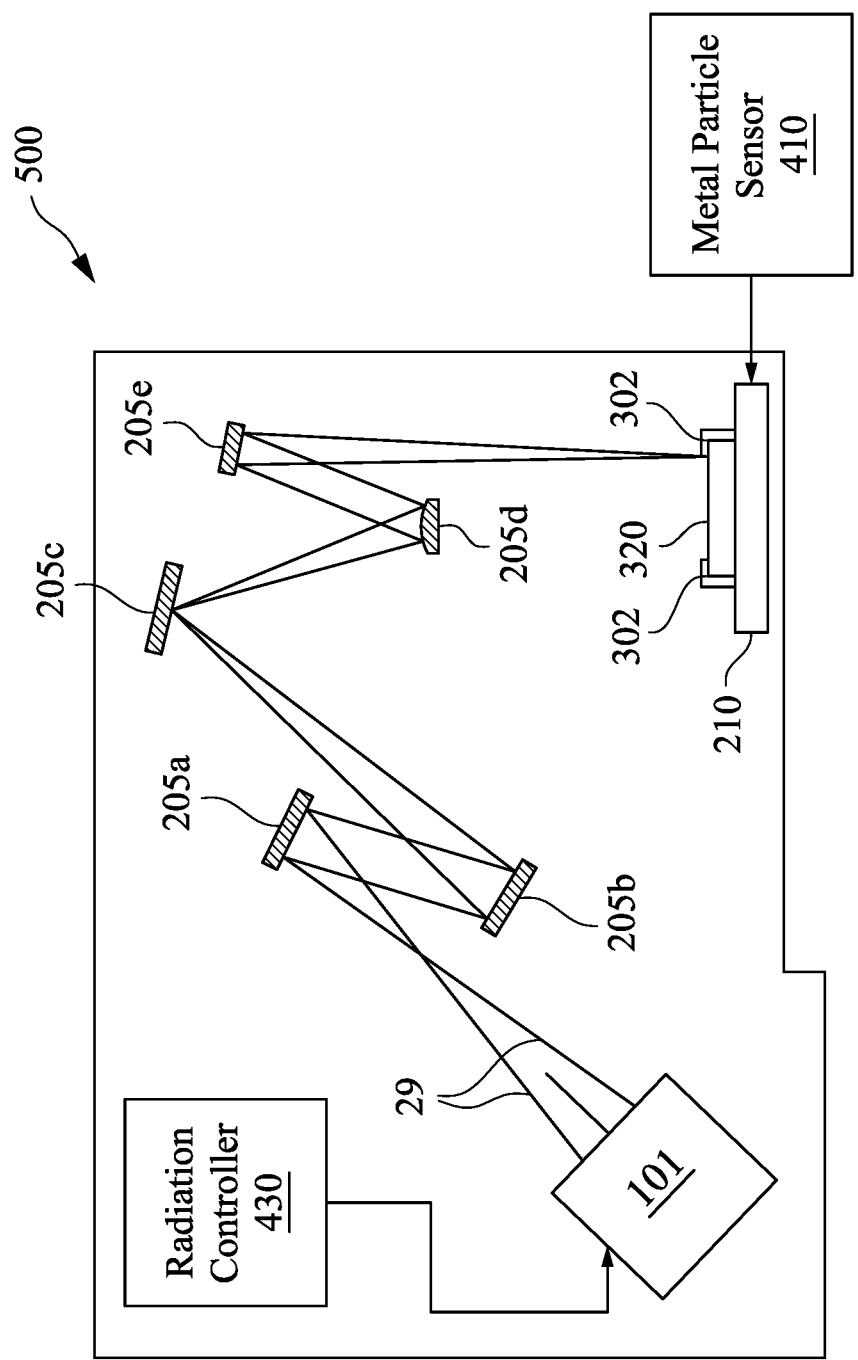
FIG. 5 shows a schematic view of an exposure device for generating a resist pattern on a wafer.

FIG. 5 shows a schematic view of an exposure device 500 for generating a resist pattern on a wafer. The exposure device 500 shows the exposure of resist layer 320 on the wafer 210, with a patterned beam of light, such as EUV light. The exposure device 500 is an integrated circuit lithography tool such as a stepper, scanner, step and scan system, direct write system, device using a contact and/or proximity mask, etc., provided with one or more optics 205a, 205b, for example, to illuminate a patterning optic, such as a reticle, e.g., a reflective mask 205c consistent with a beam of radiation 29, e.g., the EUV radiation, to produce a patterned beam, and one or more reduction projection optics 205d, 205e, of the optical system for projecting the patterned beam onto the wafer 210. A mechanical assembly (not shown) may be provided for generating a controlled relative movement between the wafer 210 and patterning optic, e.g., a reflective mask 205c. By the controlled relative movement, different dice of the wafer 210 are patterned. As further shown, the EUVL exposure device 500 of FIG. 5 includes the EUV radiation source 101 to generate the EUV radiation used to irradiate the resist layer 320 on top of the wafer 210. In some embodiments, because gas molecules absorb EUV light, the lithography system for the EUV lithography patterning, e.g., the exposure device 500 is under a vacuum environment to avoid EUV intensity loss. As shown in FIG. 5, the resist layer 320 is enclosed by the hydrophobic solvent layer 302. In some embodiments, a metal particle sensor 410, e.g., a metal particle detector, is coupled to the stage 240 to measure the number of metal particles per unit area on top of the stage 240. In addition, the exposure device 500 includes a radiation controller 430 to control an intensity of the radiation 29. In some embodiments, the metal particle counter includes a particle counter and a spectrometer. As discussed above, the metal in the resist material in some embodiments is tin and the spectrometer detects the number of tin atoms in a unit surface area.

Figure 6:
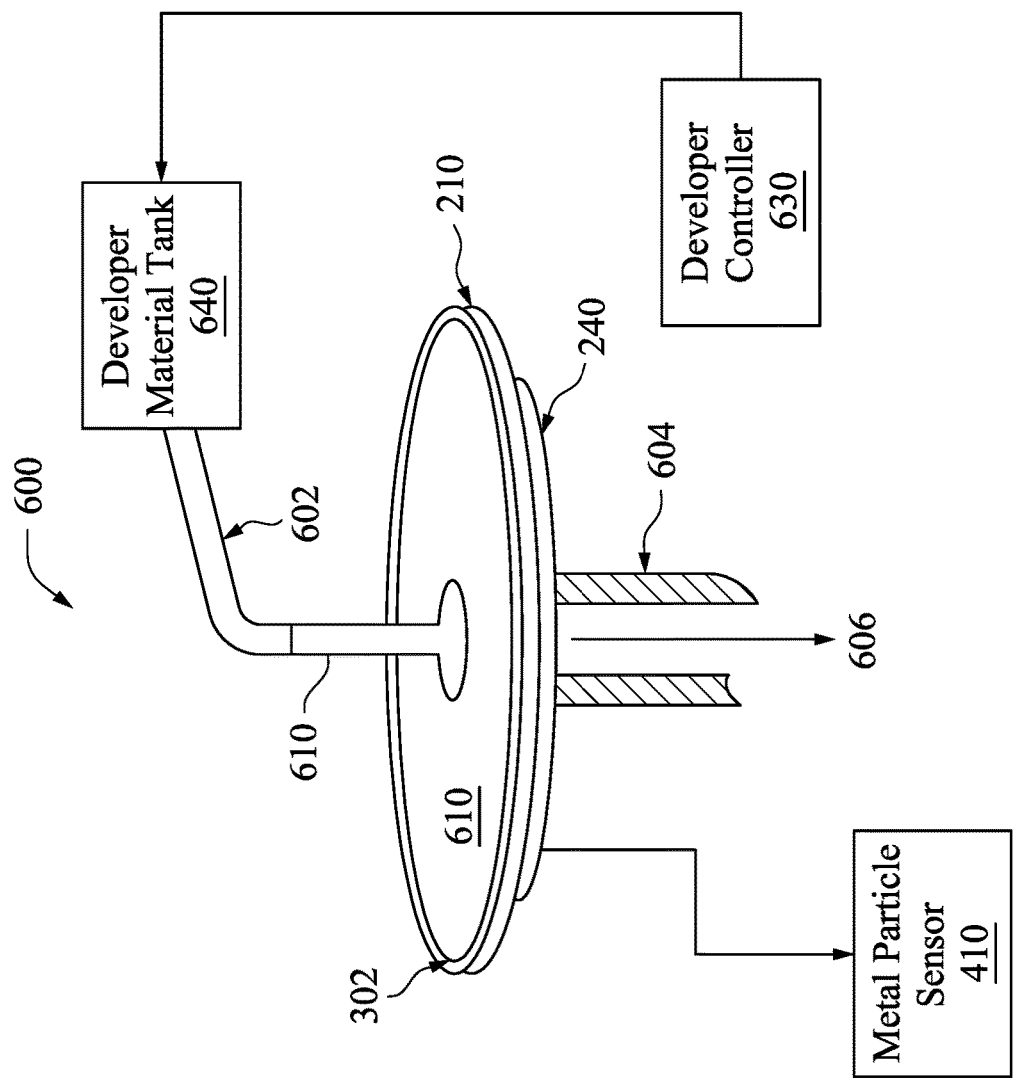
FIG. 6 shows a schematic view of a resist developer module for generating a resist pattern on a wafer.

FIG. 6 shows a schematic view of a resist developer module 600 for generating a resist pattern on a wafer. The resist developer module 600 includes the stage 240. A wafer 210 is mounted on the stage 240 by exerting vacuum through a space 606 between spindles 604 on the stage 240. In some embodiments, after the resist material is developed, depending on the type of the resist material, a portion of the resist material of the developed resist layer 320 is drained through the space 606. The wafer 210 includes a hydrophobic solvent layer 302 on the edge region 304 of the wafer 210 and a resist layer 320 (not shown) in the central region 306 of the wafer 210. A developer material 610 is delivered from a developer material tank 640, via a pipe 602, to the wafer 210 and, as shown, the developer material 610 covers the exposed resist layer 320 in the central region 306 of the wafer 210. As shown, the resist layer 320 when covered by the developer material 610 is enclosed by the hydrophobic solvent layer 302 and, thus, when the resist layer is a MePR, the hydrophobic solvent layer 302 prevents the contamination of the edge region 304 of the wafer 210 and prevents the developed MePR from touching the hydrophobic solvent layer 302 and causes the MePR to remain away from the edge of the wafer 210. In some embodiments the developed MePR is rinsed from the central region 306 of the wafer 210 by a rinsing material, e.g., deionized water, and the hydrophobic solvent layer 302 prevents the rinsed MePR from spilling over the edge of the wafer 210. In some embodiments, the metal particle sensor 410 is coupled to the stage 240 to measure the number of metal particles per unit area on top of the stage 240. The resist developer module 600 additionally includes a developer controller that controls an amount of the developer material 610 delivered to the wafer 210 and an amount of time for the development of the resist material.

Figure 7:
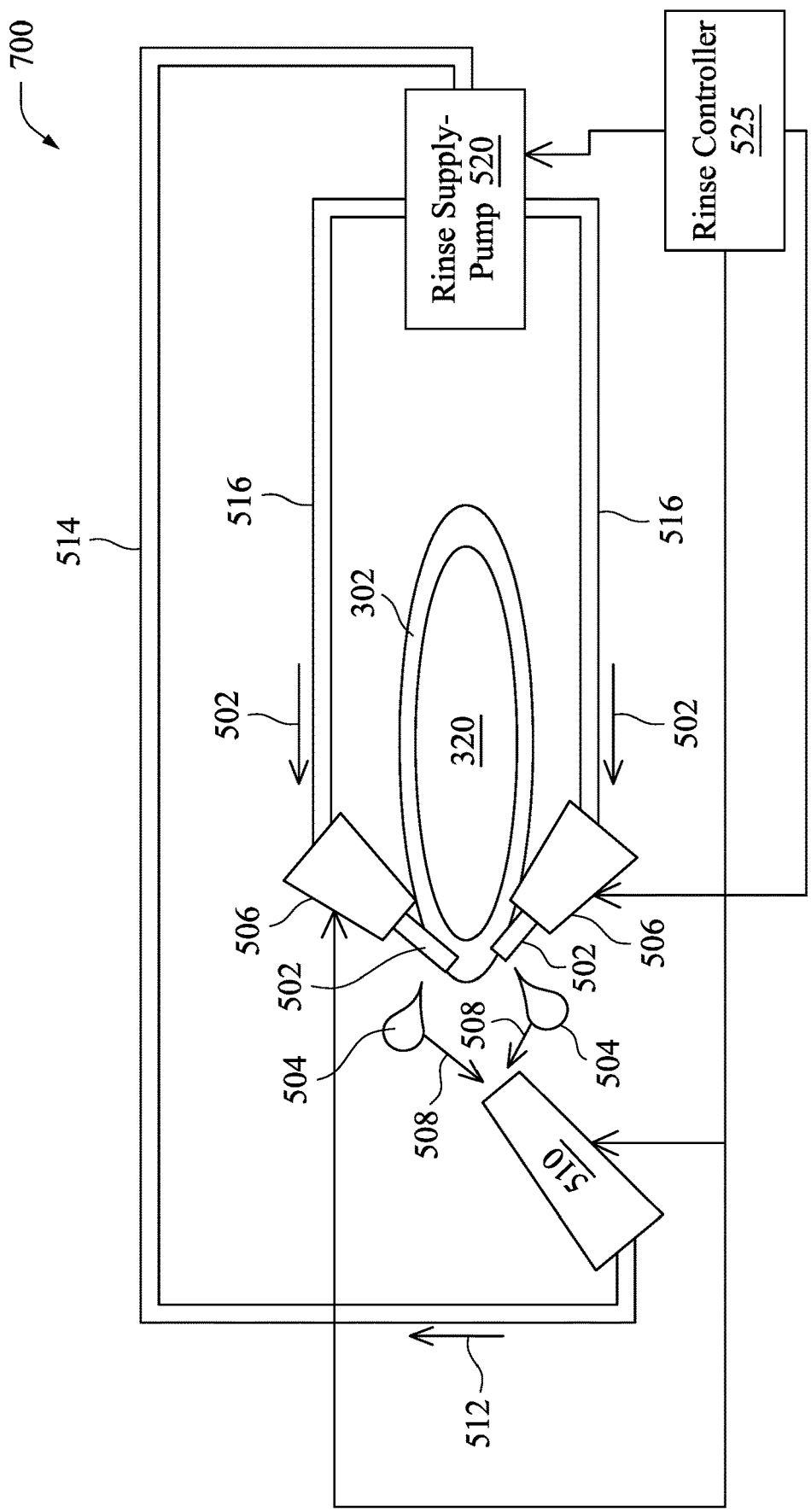
FIG. 7 shows a rinsing module for rinsing resist material deposited on an edge region of the wafer in accordance with some embodiments of the present disclosure.

FIG. 7 shows a rinsing module 700 for rinsing resist material deposited on an edge region of the wafer in accordance with some embodiments of the present disclosure. In some embodiments, after the developer material 610 is applied to the exposed resist layer in the central region 306 of the wafer 210 and a resist pattern is produced in the central region 306 of the wafer 210, the edge region 304 of the wafer 210 is rinsed in the rinsing module 700 to remove the resist material, e.g., contamination, on the edge region 304 of the wafer 210. The rinsing module 700 includes a rinse supply-pump 520 that includes a tank for a rinsing material that dissolves the resist material and a pump that delivers the rinsing material through the pipes 516 and the nozzles 506 to the edge region 304 of the wafer 210. As shown in FIG. 7, the rinse supply-pump 520 produces a flow 502 of the rinsing material in the pipes 516 and out of the nozzles 506 to rinse the resist material at the edge region 304 of the wafer 210. As shown, the rinsing module 700 extracts, e.g., sucks, used rinsing material 504 and by exerting a force 508 to the used rinsing material 504 collects the used rinsing material 504 by a nozzle 510. In some embodiments, the collected and used rinsing material 504 produces a flow 512 in a pipe 514 that returns the used rinsing material 504 to the rinse supply-pump 520 and stores the used rinsing material 504 in a separate tank for disposal. The rinsing module 700 also includes a rinse controller that controls the rinse supply-pump 520 and adjusts a flow rate of the flow 502 of the rinsing material. In some embodiments, the wafer 210 is mounted on the stage 240 (not shown) and the stage 240 rotates to allow rinsing of the entire edge region 304 of the wafer 210. In some embodiments, the rinsing material includes PGMEA and/or acetic acid.

Figure 8:
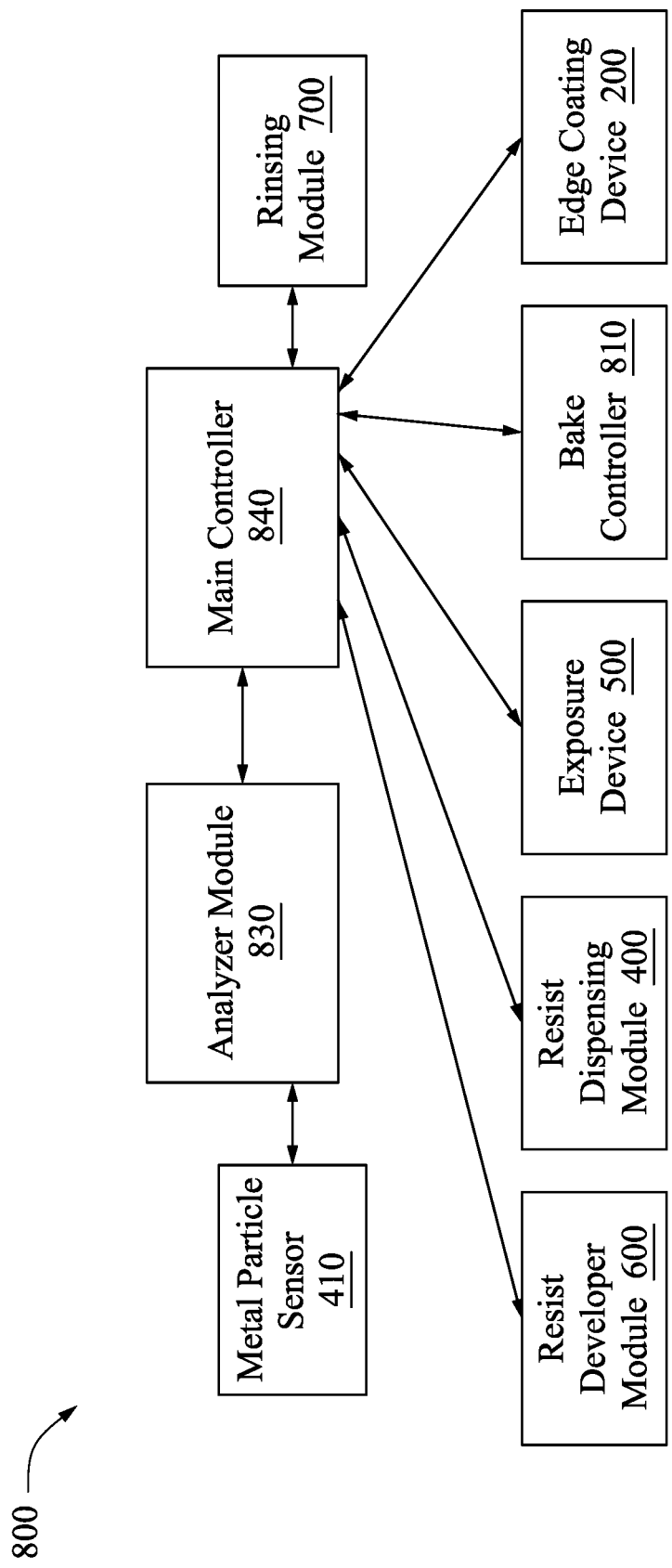
FIG. 8 shows a diagram of a system for disposing a resist pattern on a wafer in accordance with some embodiments of the present disclosure.

FIG. 8 shows a diagram of a system 800 for manufacturing a semiconductor device in accordance with some embodiments of the present disclosure. The system 800 includes an analyzer module 830 and a main controller 840 coupled to each other. The analyzer module 830 is coupled to the metal particle sensor 410 of the resist dispensing module 400, the exposure device 500, and the resist developer module 600. The analyzer module 830 receives the number of metal particles per unit area on the bevel of the wafer 210 and on top of the stage 240 and determines if the thickness of the hydrophobic solvent layer 302 needs adjustment. In some embodiments, based on the received number of metal particles per unit area, the analyzer module commands the flow-temperature controller 270 of the edge coating device 200, via the main controller 840, to adjust the flow rate of the hydrophobic solvent gas and/or adjust the amount of time the wafer 210 undergoes the edge coating operation inside the edge coating device 200 to adjust the thickness 312 of the hydrophobic solvent layer 302. In some embodiments, the analyzer module adjusts the flow rate of the hydrophobic solvent gas and/or adjusts the amount of time the wafer 210 undergoes the coating operation inside the edge coating device 200 based on separate metal particle thresholds for bare wafers and for tri-layer wafers. In some embodiments, the bare wafer threshold is between about $2e^{10}$ and $3e^{10}$ per centimeter squared. In some embodiments, the tri-layer wafer threshold is between about $45e^{10}$ and $55e^{10}$ per centimeter squared. In some embodiments, when the detected number of metal particles per unit area is above a threshold, the flow-temperature controller 270 increases the flow rate of the hydrophobic solvent gas and/or adjusts the amount of time the wafer 210 undergoes edge coating inside the edge coating device 200. In some embodiments, the analyzer module determines the amount of flow rate or time increase.

The system 800 further includes a bake controller 810 that controls the PAB operation 106 and the PEB operation 110 of FIG. 1 via the main controller 840. In addition, the main controller is coupled to and controls the resist developer module 600, the resist dispensing module 400, the exposure device 500, and the edge coating device 200.

Figure 9:
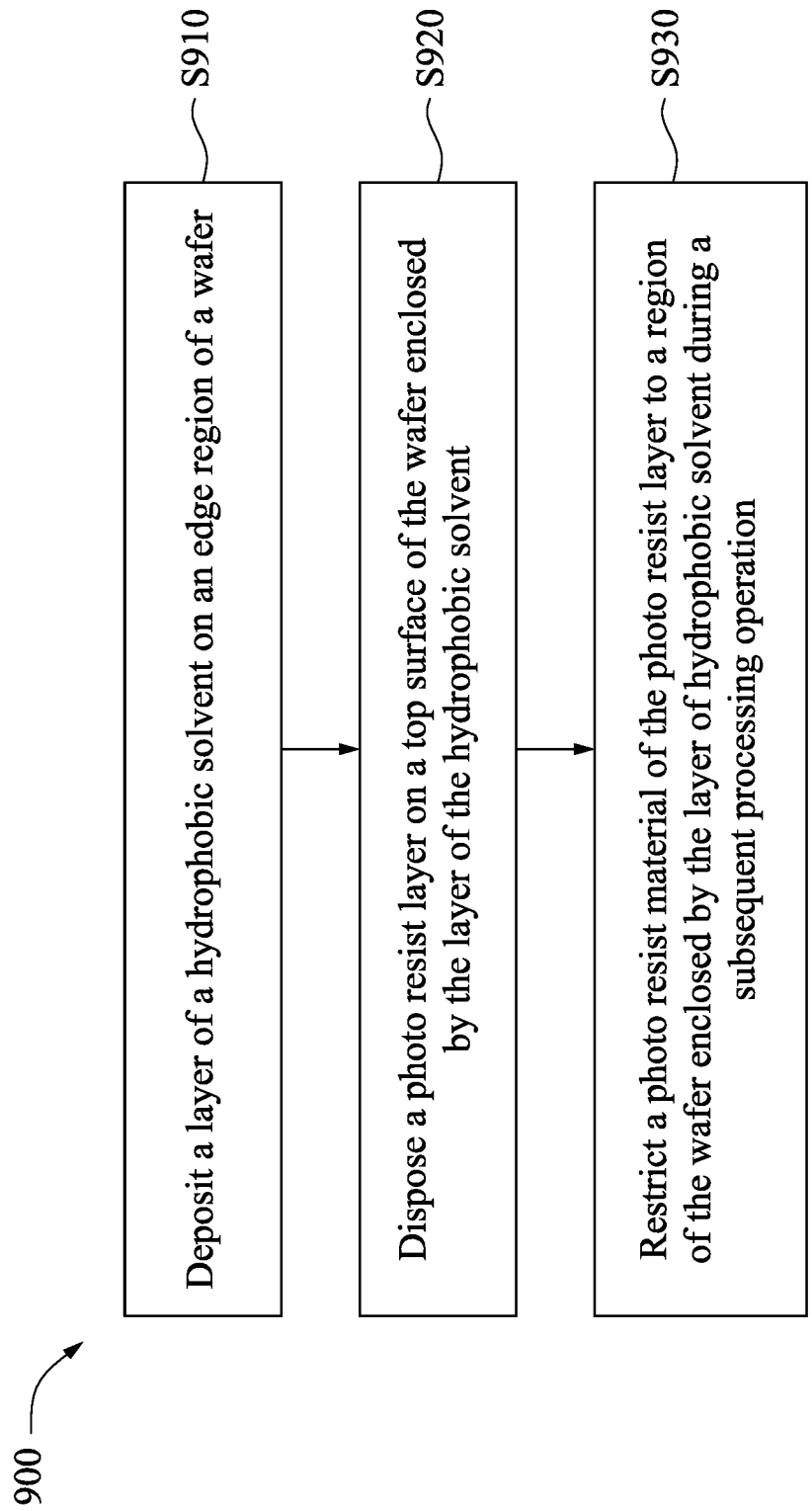
FIG. 9 shows a flow diagram of a process for disposing a resist pattern in accordance with some embodiments of the present disclosure.

FIG. 9 shows a flow diagram of a process 900 for manufacturing a semiconductor device in accordance with some embodiments of the present disclosure. The process 900 or a portion of the process 900 may be performed by the system of FIG. 8 described above. In some embodiments, the process 900 or a portion of the process 900 is performed and/or is controlled by the computer system 1000 described below with respect to FIGS. 10A and 10B. The method includes an operation S910, where a layer of a hydrophobic solvent is deposited on an edge region of a wafer. As shown in FIG. 2, the edge coating device 200 deposits a layer of the hydrophobic solvent in the edge region 213, which is consistent with the edge region 304, of the wafer 210.

In operation S920, a photo resist layer is disposed on a top surface of the wafer enclosed by the layer of the hydrophobic solvent. As shown in FIG. 4A, the resist layer 320 is formed by the resist dispensing module 400 on the upper surface 300A of the central region 306 of the wafer 210, and the resist layer 320 is enclosed inside the hydrophobic solvent layer 302. In operation S930, a photo resist material of the photo resist layer is restricted to a region of the wafer enclosed by the layer of hydrophobic solvent during a subsequent processing operation. As shown in FIG. 4A, the resist layer 320 is contained, inside the hydrophobic solvent layer 302.

Figure 10A:
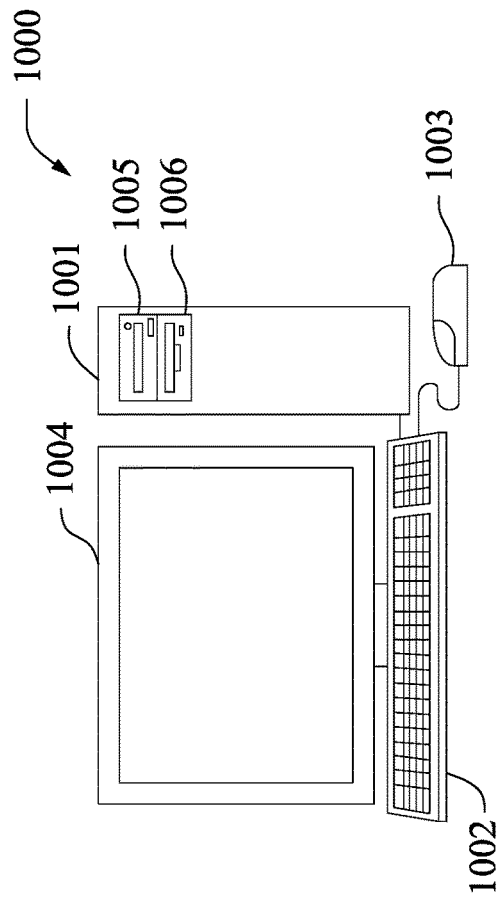
FIGS. 10A and 10B illustrate an apparatus for controlling the manufacturing of a semiconductor device in accordance with some embodiments of the present disclosure.
Figure 10B:
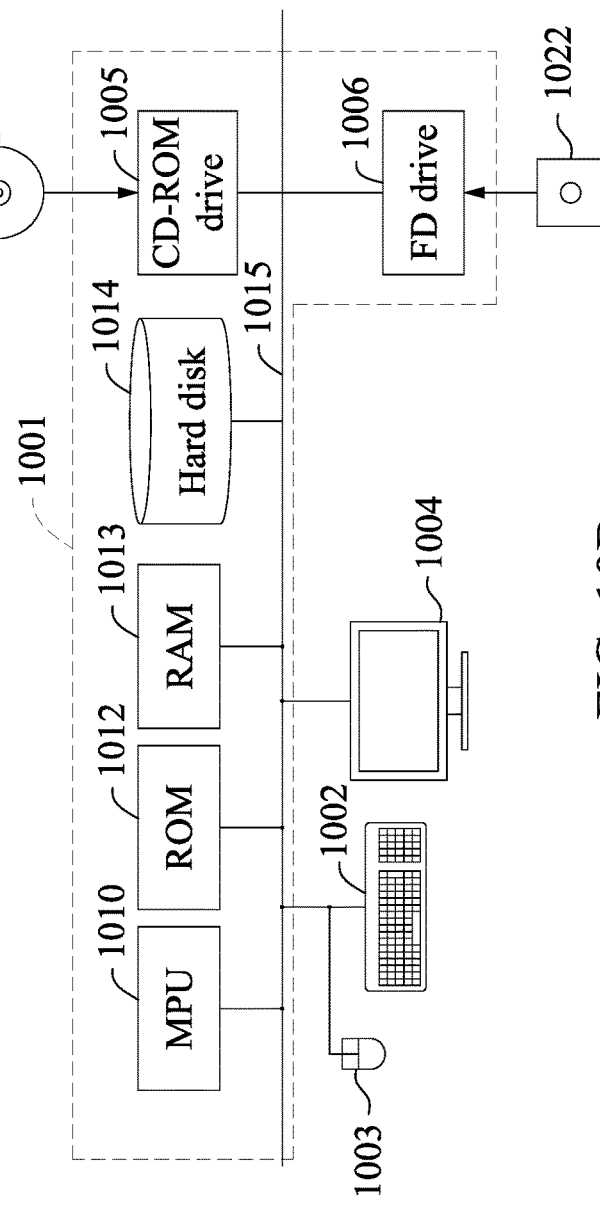

FIGS. 10A and 10B illustrate an apparatus for controlling the manufacturing of a semiconductor device in accordance with some embodiments of the present disclosure. In some embodiments, the computer system 1000 is used for performing the functions of the modules of FIG. 8 and includes the main controller 840, the analyzer module 830, the flow-temperature controller 270 of the edge coating device 200, the resist dispense controller 220 of the resist dispensing module 400, the radiation controller of the exposure device 500, the developer controller 630 of the resist developer module 600, and the rinse controller 525 of the rinsing module 700. In some embodiments, the computer system 1000 is used to execute the process 900 of FIG. 9.

FIG. 10A is a schematic view of a computer system that performs the functions of an apparatus for disposing a resist pattern on a semiconductor substrate. All of or a part of the processes, method and/or operations of the foregoing embodiments can be realized using computer hardware and computer programs executed thereon. In FIG. 10A, a computer system 1000 is provided with a computer 1001 including an optical disk read only memory (e.g., CD-ROM or DVD-ROM) drive 1005 and a magnetic disk drive 1006, a keyboard 1002, a mouse 1003, and a monitor 1004.

FIG. 10B is a diagram showing an internal configuration of the computer system 1000. In FIG. 10B, the computer 1001 is provided with, in addition to the optical disk drive 1005 and the magnetic disk drive 1006, one or more processors, such as a micro processing unit (MPU) 1010, a ROM 1012 in which a program such as a boot up program is stored, a random access memory (RAM) 1013 that is connected to the MPU 1010 and in which a command of an application program is temporarily stored and a temporary storage area is provided, a hard disk 1014 in which an application program, a system program, and data are stored, and a bus 1015 that connects the MPU 1010, the ROM 1012, and the like. Note that the computer 1001 may include a network card (not shown) for providing connection to a LAN.

The program for causing the computer system 1000 to execute the functions for disposing a resist pattern on a semiconductor substrate in the foregoing embodiments may be stored in an optical disk 1021 or a magnetic disk 1022, which are inserted into the optical disk drive 1005 or the magnetic disk drive 1006, and transmitted to the hard disk 1014. Alternatively, the program may be transmitted via a network (not shown) to the computer 1001 and stored in the hard disk 1014. At the time of execution, the program is loaded into the RAM 1013. The program may be loaded from the optical disk 1021 or the magnetic disk 1022, or directly from a network. The program does not necessarily have to include, for example, an operating system (OS) or a third party program to cause the computer 1001 to execute the functions of the system for disposing a resist pattern on a semiconductor substrate. The program may only include a command portion to call an appropriate function (module) in a controlled mode and obtain desired results.

According to some embodiments of the present disclosure, a method of manufacturing a semiconductor device includes depositing a layer of a hydrophobic solvent on an edge region of a wafer. The method also includes disposing a photo resist layer on a top surface of the wafer enclosed by the layer of the hydrophobic solvent. The method further includes restricting a photo resist material of the photo resist layer to a region of the wafer enclosed by the layer of hydrophobic solvent during a subsequent processing operation. In an embodiment, the photo resist material is a metal-containing photo resist material (MePR) and the subsequent processing operation is development of the photo resist layer. In an embodiment, a width of the deposited layer of a hydrophobic solvent is between about 1 percent to about 5 percent of a radius of the wafer. In an embodiment, the hydrophobic solvent is hexamethyldisilazane (HMDS). In an embodiment, the method further includes maintaining the wafer at a temperature between about 50° C. to about 180° C. during the deposition of the layer of the hydrophobic solvent. In an embodiment, the method further includes projecting, by extreme ultraviolet (EUV) radiation, a photo mask pattern onto the photo resist layer enclosed by the layer of the hydrophobic solvent to expose the photo resist layer to the EUV radiation, developing the exposed the photo resist layer to produce a resist pattern enclosed by the layer of the hydrophobic solvent on the wafer, and rinsing the photo resist material from the edge region of the wafer. In an embodiment, the method further includes maintaining a flow rate of about 0.5 L/m during the deposition of the layer of the hydrophobic solvent over the edge region of the wafer.

According to some embodiments of the present disclosure, a method of manufacturing a semiconductor device includes flowing a hydrophobic solvent as a gas over a bevel region of a wafer. The method also includes depositing a layer of the hydrophobic solvent on an upper bevel of the bevel region on a top surface of the wafer and on a lower bevel of the bevel region on a bottom surface of the wafer. The method further includes disposing a metal-containing photo resist (MePR) layer on an internal region of the top surface of the wafer enclosed by the bevel region and restricting a photo resist material of the MePR layer inside the internal region of the top surface of the wafer during a subsequent processing operation. In an embodiment, the method further includes maintaining the wafer at a temperature between about 50° C. to about 180° C. during the deposition of the layer of the hydrophobic solvent, and maintaining the flowing of the hydrophobic solvent at a flow rate between about 0.1 L/min and 4 L/min during the deposition of the layer of the hydrophobic solvent. In an embodiment, a width of the upper bevel is between about 1 percent to about 5 percent of a radius of the wafer and a width of the lower bevel is between about 1 percent to about 5 percent of a radius of the wafer. In an embodiment, the method further includes projecting, by extreme ultraviolet (EUV) radiation, a photo mask pattern onto the MePR layer that is enclosed by the layer of the hydrophobic solvent to expose the MePR layer to the EUV radiation, developing the MePR layer to produce a resist pattern enclosed by the layer of the hydrophobic solvent on the wafer, and rinsing the photo resist material from the edge region of the wafer. In an embodiment, the hydrophobic solvent is hexamethyldisilazane (HMDS). In an embodiment, a thickness of the layer of the hydrophobic solvent is within about 0.2 percent and 10 percent of a thickness of the MePR layer. In an embodiment, the method further includes flowing the hydrophobic solvent over the bevel region of the wafer between about 30 minutes and about 2 hours.

According to some embodiments of the present disclosure, a system for manufacturing a semiconductor device includes an edge coating device that includes a first stage for mounting a substrate. The first stage includes a heating element. The edge coating device also includes a first shielding disk mounted over the first stage. The first shielding disk is spaced-apart and parallel to a main surface of the first stage. The first shielding disk is covers a central region of a substrate to be mounted on the first stage and expose an edge region of the substrate. The edge coating device further includes one or more first openings that are over the first shielding disk. The one or more openings are direct a solvent as a gas over the first shielding disk to an edge region of the substrate to be mounted on the first stage to produce an edge-coated substrate. The edge coating device includes one or more second openings passing through the first shielding disk. The one or more second openings are direct a purge gas through a gap between the edge-coated substrate mounted on the first stage and first shielding disk. The edge coating device also includes a resist dispensing module that includes a second stage to dispose a resist layer on a central region of the edge-coated substrate mounted on the second stage. In an embodiment, the edge coating device also includes a second disk mounted in parallel to the main surface of the first stage. The second disk directs the purge gas parallel to the main surface of the first stage. In an embodiment, the edge coating device further includes a flow-temperature controller coupled to the heating element of the first stage that controls a temperature of the first stage. In an embodiment, the edge coating device also includes first and second input gas ports, a first gas tank containing a solvent and coupled to the flow-temperature controller, and a second gas tank containing the purge gas and coupled to the flow-temperature controller. The edge coating device further includes a first pipe connected between the first gas tank and the first input gas port to deliver the solvent to the one or more first openings over the first shielding disk. The flow-temperature controller controls a flow rate of the solvent in the edge coating device and a time period the solvent is deposited on an edge region of a substrate mounted on the first stage. The edge coating device includes a second pipe connecting the second gas tank and the second input gas port to deliver the purge gas to the one or more second openings over a second shielding disk. The flow-temperature controller controls a flow of the purge gas in the edge coating device. The edge coating device also includes one or more output gas ports. The one or more output gas ports provide a path for the purge gas and a portion of the solvent that is not deposited to exit the edge coating device. In an embodiment, the system further includes a main controller and an analyzer module coupled to the main controller. The resist dispensing module further includes a metal particle sensor coupled to the second stage to measure a number of metal particles per unit area on the second stage. The metal particle sensor is coupled to the analyzer module, and the analyzer module receives the measured number of metal particles per unit area on the second stage. The analyzer module determines the flow rate of a solvent gas in the edge coating device and the time period a solvent is deposited on an edge region of a substrate in the edge coating device based on the measured number of metal particles. The main controller adjusts the flow rate of the solvent gas in the edge coating device and the time period the solvent is deposited on the edge region of the substrate in the edge coating device based on the determination of the analyzer module. In an embodiment, the system further includes an exposure device to project a layout pattern of a reticle on a resist layer on an edge-coated substrate to produce an exposed resist layer, a developer module to develop an exposed resist layer on the edge-coated substrate to produce a resist pattern, and a rinsing module to rinse an edge region of the edge-coated substrate after the development of the resist pattern.

As described in the foregoing embodiments, using the hydrophobic solvent layer 302 for edge coating does not require baking of the edge coat and does not require removing of the edge coat before the exposure operation 108 and redepositing the edge coat after the exposure operation 108 and, thus, improves the process speed. In addition, use of the hydrophobic solvent layer prevents metal contamination of the semiconductor device processing tools of the production line.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
   flowing a hydrophobic solvent as a gas over an edge region of a wafer;
   depositing a layer of the hydrophobic solvent on the edge region of the wafer;
   disposing a photo resist layer on a top surface of the wafer, wherein the photo resist layer is enclosed by the layer of the hydrophobic solvent;
   restricting a photo resist material of the photo resist layer to a region of the wafer enclosed by the layer of the hydrophobic solvent during a subsequent processing operation, wherein the photo resist material is a metal-containing photo resist material (MePR);
   measuring a number of metal particles per unit area after the disposing a photo resist layer on a top surface of the wafer;

determining a flow rate of the hydrophobic solvent and a time period the hydrophobic solvent is deposited on the edge region of the wafer based on the measured number of metal particles per unit area; and adjusting the flow rate of the hydrophobic solvent and the time period the hydrophobic solvent is deposited on the edge region of the wafer when the number of metal particles per unit area exceeds a threshold value of between about $2\times10^{10}$ to $3\times10^{10}$ metal particles/cm$^2$ for a bare wafer and between about $45\times10^{10}$ to $55\times10^{10}$ metal particles/cm$^2$ for a resist coated wafer.

2. The method of claim 1, wherein the subsequent processing operation is development of the photo resist layer.

3. The method of claim 1, wherein a width of the deposited layer of the hydrophobic solvent is between about 3 percent to about 5 percent of a radius of the wafer.

4. The method of claim 1, wherein the hydrophobic solvent is hexamethyldisilazane (HMDS).

5. The method of claim 1, further comprising:
maintaining the wafer at a temperature between about 50° C. to about 180° C. during the deposition of the layer of the hydrophobic solvent.

6. The method of claim 1, further comprising:
projecting, by extreme ultraviolet (EUV) radiation, a photo mask pattern onto the photo resist layer enclosed by the layer of the hydrophobic solvent to expose the photo resist layer to the EUV radiation;
developing the exposed photo resist layer to produce a resist pattern enclosed by the layer of the hydrophobic solvent on the wafer; and
rinsing the photo resist material from the edge region of the wafer.

7. The method of claim 1, further comprising:
maintaining a flow rate of 0.5 liter per minute (L/m) over the edge region of the wafer during the deposition of the layer of the hydrophobic solvent.

8. A method of manufacturing a semiconductor device, comprising:
flowing a hydrophobic solvent as a gas over a bevel region of a wafer;
depositing a layer of the hydrophobic solvent on an upper bevel of the bevel region on a top surface of the wafer and on a lower bevel of the bevel region on a bottom surface of the wafer;
disposing a metal-containing photo resist (MePR) layer on an internal region of the top surface of the wafer enclosed by the bevel region;
restricting a photo resist material of the MePR layer inside the internal region of the top surface of the wafer during a subsequent processing operation;
measuring a number of metal particles per unit area after the disposing a metal-containing photo resist (MePR) layer on an internal region of the top surface of the wafer enclosed by the bevel region;
determining a flow rate of the hydrophobic solvent and a time period the hydrophobic solvent is deposited on the bevel region of the wafer based on the measured number of metal particles per unit area; and
adjusting the flow rate of the hydrophobic solvent and the time period the hydrophobic solvent is deposited on the bevel region of the wafer when the number of metal particles per unit area exceeds a threshold value of between about $2\times10^{10}$ to $3\times10^{10}$ metal particles/cm$^2$ for a bare wafer and between about $45\times10^{10}$ to $55\times10^{10}$ metal particles/cm$^2$ for a resist coated wafer.

9. The method of claim 8, further comprising:
maintaining the wafer at a temperature between about 50° C. to about 180° C. during the deposition of the layer of the hydrophobic solvent; and
maintaining the flowing of the hydrophobic solvent at a flow rate between about 0.2 L/min and 2 L/min during the deposition of the layer of the hydrophobic solvent.

10. The method of claim 8, wherein a width of the upper bevel is between about 1 percent to about 5 percent of a radius of the wafer and a width of the lower bevel is between about 1 percent to about 5 percent of a radius of the wafer.

11. The method of claim 8, further comprising:
projecting, by extreme ultraviolet (EUV) radiation, a photo mask pattern onto the MePR layer enclosed by the layer of the hydrophobic solvent to expose the MePR layer to the EUV radiation;
developing the MePR layer to produce a resist pattern enclosed by the layer of the hydrophobic solvent on the wafer; and
rinsing the photo resist material from the bevel region of the wafer.

12. The method of claim 8, wherein the hydrophobic solvent is hexamethyldisilazane (HMDS).

13. The method of claim 8, wherein a thickness of the layer of the hydrophobic solvent is within about 0.2 percent and 10 percent of a thickness of the MePR layer.

14. The method of claim 8, further comprising:
flowing the hydrophobic solvent over the bevel region of the wafer between about 30 minutes and about 2 hours.

15. A method of manufacturing a semiconductor device, comprising:
mounting a substrate over a first substrate stage;
mounting a first shielding disk over the substrate, wherein the first shielding disk is spaced-apart and parallel to a main surface of the first stage, and the first shielding disk covers a central region of the substrate and exposes an edge region of the substrate;
directing a solvent gas over the first shielding disk to the edge region of the substrate to produce an edge-coated substrate;
removing the first shielding disk;
transferring the substrate from the first stage to a second stage;
depositing a photo resist over a central region of the edge-coated substrate;
measuring a number of metal particles per unit area on the second stage after the depositing a photo resist over a central region of the edge-coated substrate;
determining a flow rate of the solvent gas and a time period the solvent gas is deposited on the edge region of the substrate based on the measured number of metal particles per unit area; and
adjusting the flow rate of the solvent gas and the time period the solvent gas is deposited on the edge region of the substrate when the number of metal particles per unit area exceeds a threshold value of between about $2\times10^{10}$ to $3\times10^{10}$ metal particles/cm$^2$ for a bare substrate and between about $45\times10^{10}$ to $55\times10^{10}$ metal particles/cm$^2$ for a resist coated substrate.

16. The method of claim 15, further comprising directing a purge gas over the substrate during the directing a solvent gas over the first shielding disk to the edge region of the substrate.

17. The method of claim 15, further comprising heating the first stage at a temperature ranging from 50° C. to 180° C. during the directing a solvent gas over the first shielding disk.

18. The method of claim 15, further comprising:
projecting a layout pattern onto the photo resist using actinic radiation; and
developing the photo resist to form a pattern in the photo resist.

19. The method of claim 15, wherein the metal particles are tin.

20. The method of claim 15, wherein the solvent gas is hexamethyldisilazane (HMDS).

\* \* \* \* \*